US006977345B2

(12) United States Patent
Budell et al.

(10) Patent No.: US 6,977,345 B2

(45) Date of Patent: Dec. 20, 2005

(54) VENTS WITH SIGNAL IMAGE FOR SIGNAL RETURN PATH

(75) Inventors: Timothy W. Budell, Milton, VT (US); Thomas P. Comino, Vestal, NY (US); Todd W. Davies, Vestal, NY (US); Ross W. Keesler, Endicott, NY (US); Steven G. Rosser, Owego, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 10/042,031

(22) Filed: Jan. 8, 2002

(65) Prior Publication Data

US 2003/0127249 A1 Jul. 10, 2003

(51) Int. Cl.[7] ........................ H05K 1/00

(52) U.S. Cl. ........................ 174/250; 174/261; 29/846; 29/847

(58) Field of Search ........................ 174/250, 254, 174/255, 261; 361/753, 780, 794, 799, 800, 361/816, 818; 331/1; 29/830, 846, 847

(56) References Cited

U.S. PATENT DOCUMENTS 4,085,390 A 4/1978 Standing
4,729,061 A 3/1988 Brown
5,111,164 A 5/1992 De Ronde
5,363,280 A 11/1994 Chobot et al.
5,479,138 A * 12/1995 Kuroda et al. ................. 333/1
5,519,176 A * 5/1996 Goodman et al. .......... 174/255
5,523,921 A 6/1996 Van Lydegraf
6,163,233 A 12/2000 Adkins
6,184,477 B1 * 2/2001 Tanahashi .................. 174/261
6,184,478 B1 * 2/2001 Imano et al. .............. 174/261
6,433,286 B1 * 8/2002 Doberenz .................. 174/261

* cited by examiner

*Primary Examiner*—Kamand Cuneo
*Assistant Examiner*—Jeremy Norris
(74) *Attorney, Agent, or Firm*—Schmeiser, Olsen & Watts; William H. Steinberg

(57) ABSTRACT

A method, structure, and method of design relating an electrical structure that includes a metal voltage plane laminated to a dielectric substrate. A determination is made as to where to place an opening for venting gases generated during fabrication of the dielectric laminate. An identification is made of a problematic opening in the metal voltage plane that is above or below a corresponding metal signal line within the dielectric laminate, such that an image of a portion of the corresponding metal signal line projects across the problematic opening. An electrically conductive strip is positioned across the problematic opening, such that the strip includes the image. In fabrication, the dielectric substrate having the metal signal line therein is provided. The metal voltage plane is laminated to the dielectric substrate. The opening in the metal voltage plane is formed such that the strip is across the opening and includes the image.

11 Claims, 5 Drawing Sheets

VENTS WITH SIGNAL IMAGE FOR SIGNAL RETURN PATH

BACKGROUND OF THE INVENTION

1. Technical Field

The present invention relates to a method and structure for venting gases formed during fabrication of a laminate without degradation of performance of alternating current flow in metal signal lines within the laminate.

2. Related Art

Gases formed during fabrication of dielectric laminates may cause catastrophic mechanical failure if not adequately vented. Although clearances in internal power planes aid in this venting, additional venting may be needed. Unfortunately, such additional venting in a voltage plane near signal lines within the laminate may degrade performance of an alternating current (AC) that flows through the signal lines, because such additional venting modifies the electrical path of the alternating current in the voltage plane. Such degraded electrical performance may include: increased characteristic impedance, increased signal loop inductance, increased signal time delay, increased crosstalk with adjacent signal traces, etc. Thus, there is a need for a method and structure for venting gases formed during fabrication of a laminate without degradation of performance of alternating current flow within the laminate.

SUMMARY OF THE INVENTION

The present invention provides an electrical structure, comprising:

a dielectric substrate having a metal signal line therein; and a metal voltage plane laminated to a surface of the dielectric substrate, wherein the metal voltage plane includes an opening, wherein an image of a portion of the metal signal line projects across the opening, and wherein an electrically conductive strip across the opening includes the image.

The present invention provides a method for forming an electrical structure, comprising:

providing a dielectric substrate having a metal signal line therein;

laminating a metal voltage plane to a surface of the dielectric substrate; and forming an opening in the metal voltage plane such that an electrically conductive strip across the opening includes an image of a portion of the metal signal line, wherein the image projects across the opening.

The present invention provides a method for designing an electrical structure that includes a dielectric laminate, said method comprising:

designing the dielectric laminate to include at least one dielectric substrate and at least one metal voltage plane, wherein a first metal voltage plane of the at least one metal voltage plane is laminated to a first dielectric substrate of the at least one dielectric substrate;

determining where in the at least one metal voltage plane to place openings for venting of gases generated during fabrication of the dielectric laminate;

determining at least one problematic opening of the openings, wherein the at least one problematic opening is above or below a corresponding metal signal line within the dielectric laminate such that an image of a portion of the corresponding metal signal line projects across the at least one problematic opening; and designing the at least one problematic opening to include an electrically conductive strip across the at least one problematic opening, wherein the electrically conductive strip includes the image.

The present invention provides a method, structure, and method of design for venting gases formed during fabrication of a laminate without degradation of performance of alternating current flow within the laminate.

DETAILED DESCRIPTION OF THE INVENTION

Figure 1:
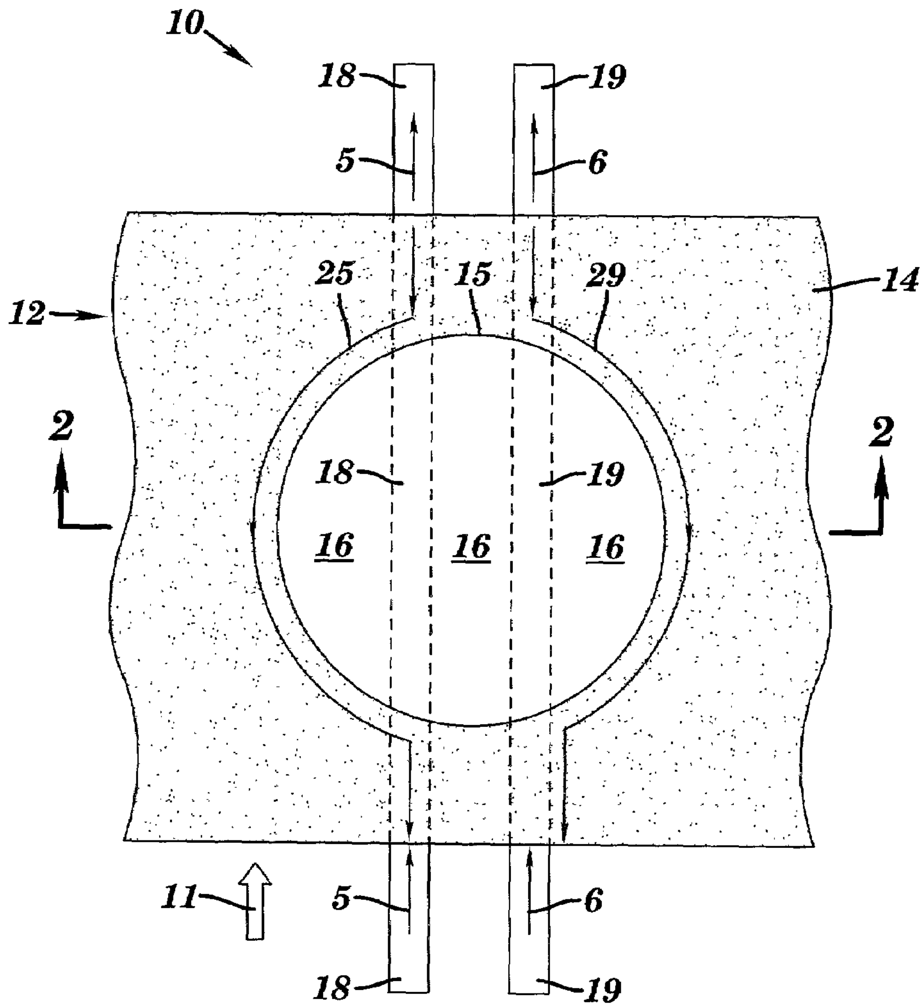
FIG. 1 depicts a top view of an electrical structure having metal voltage planes laminated to a dielectric substrate, said substrate including a metal signal line therein, said metal voltage planes having openings therein, in accordance with embodiments of the present invention.
Figure 2:
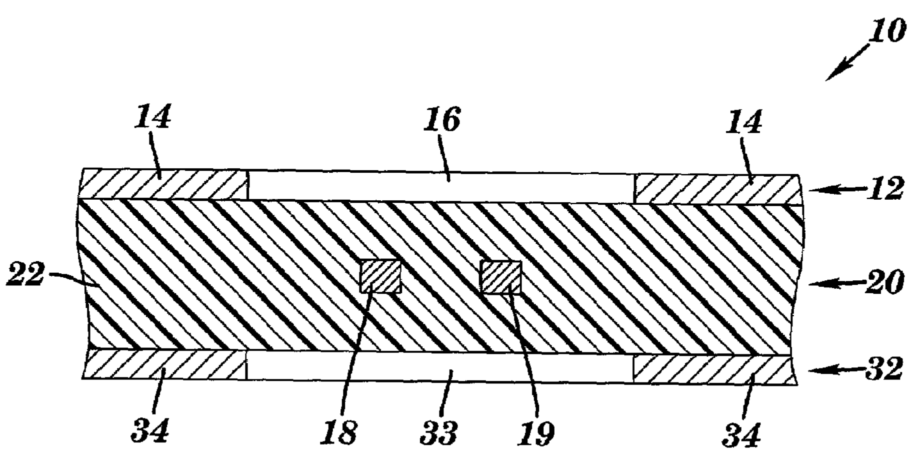
FIG. 2 depicts a front cross-sectional view taken along line 2—2 of FIG. 1, in accordance with embodiments of the present invention.

FIG. 1 depicts a top view of an electrical structure 10, and FIG. 2 depicts a front cross-sectional view taken along line 2—2 of FIG. 1, in accordance with embodiments of the present invention. The electrical structure 10 includes metal voltage planes 12 and 32 laminated to a dielectric substrate 20. "Laminating" of layers, planes, etc. is defined herein as uniting said layers, planes, etc. in any manner known to one of ordinary skill in the art (e.g., by adhesive coupling). Similarly, a "laminate" is a series of layers, planes, etc. that has been formed by "laminating." The dielectric substrate 20 includes a dielectric material 22 (e.g., polyimide, epoxy-glass composite, FR4, alumina, ceramic, polytetrafluoroethylene, BT resin, etc.) and metal signal lines 18 and 19. The metal signal lines 18 and 19 each include an electrically conductive material such as a metal, a metallic alloy, or a non-metallic conductor (e.g., copper, molybdenum, aluminum, conductive ink, etc.) that is known to one of ordinary skill in the art as being suitable for carrying an alternating current. The metal voltage plane 12 is a contiguous metal layer that includes a material 14 on which a voltage V is held constant. The material 14 includes an electrically conductive material such as a metal, a metallic alloy, or a non-metallic conductor (e.g., copper, molybdenum, aluminum, conductive ink, etc. The metal voltage plane 12 may be, inter alia, a ground plane (V=0) or a power plane (V≠0). The metal voltage plane 12 includes an opening (or "vent hole") 16 which may serve to vent gases generated in the dielectric material 22 during fabrication of the electrical structure 10. The opening 16 may be formed in the metallic material 14 of the metal voltage plane 12 by any method known to one of ordinary skill in the art, such as by, inter alia, chemical etching in combination with lithography to define the opening 16 to be created by etching. Alternatively, the opening 16 may be formed in the metallic material 14 of the metal voltage plane 12 by mechanical or laser drilling. The opening 16 may be formed either before or after the metal voltage plane 12 is laminated to the dielectric substrate 20. Although, the opening 16 is shown in FIG. 1 as having a boundary 15 that is circular, the boundary 15 is a generally closed curve of any geometrical shape: circular or non-circular (e.g., elliptical). The metal voltage plane 32 is contiguous metal layer that includes a metallic material 32. The metal voltage plane 32 has material and voltage properties that are analogous to those of the metal voltage plane 12. The metal voltage plane 32 includes an opening 33 that has physical, geometrical, and functional properties that are analogous to those of the opening 16. The opening 33 could may be formed in the metallic material 34 of the metal voltage plane 32 by any method described supra for forming the opening 16.

If in FIGS. 1 and 2 an alternating electrical current were to flow along an electrical flow path 5 in the signal line 18 in a direction 11, there would be an electrical return flow path 25 in the metal voltage plane 12 due to an electrically disrupting effect of the opening 16, and a geometrically analogous return path in the metal voltage plane 32 due to an electrically disrupting effect of the opening 33. Similarly, if an alternating electrical current were to flow along an electrical flow path 6 in the signal line 19 in the direction 11, there would be an electrical return flow path 29 in the metal voltage plane 12 due to an electrically disrupting effect of the opening 16, and a geometrically analogous return path in the metal voltage plane 32 due to an electrically disrupting effect of the opening 33. The electrical return flow paths 25 and 29 (and geometrically analogous return paths in the metal voltage plane 32) cause degraded electrical performance. Fortunately, the present invention avoids the electrical return flow paths 25 and 29, and associated degraded electrical performance, as explained infra in conjunction with FIGS. 3–8.

Figure 3:
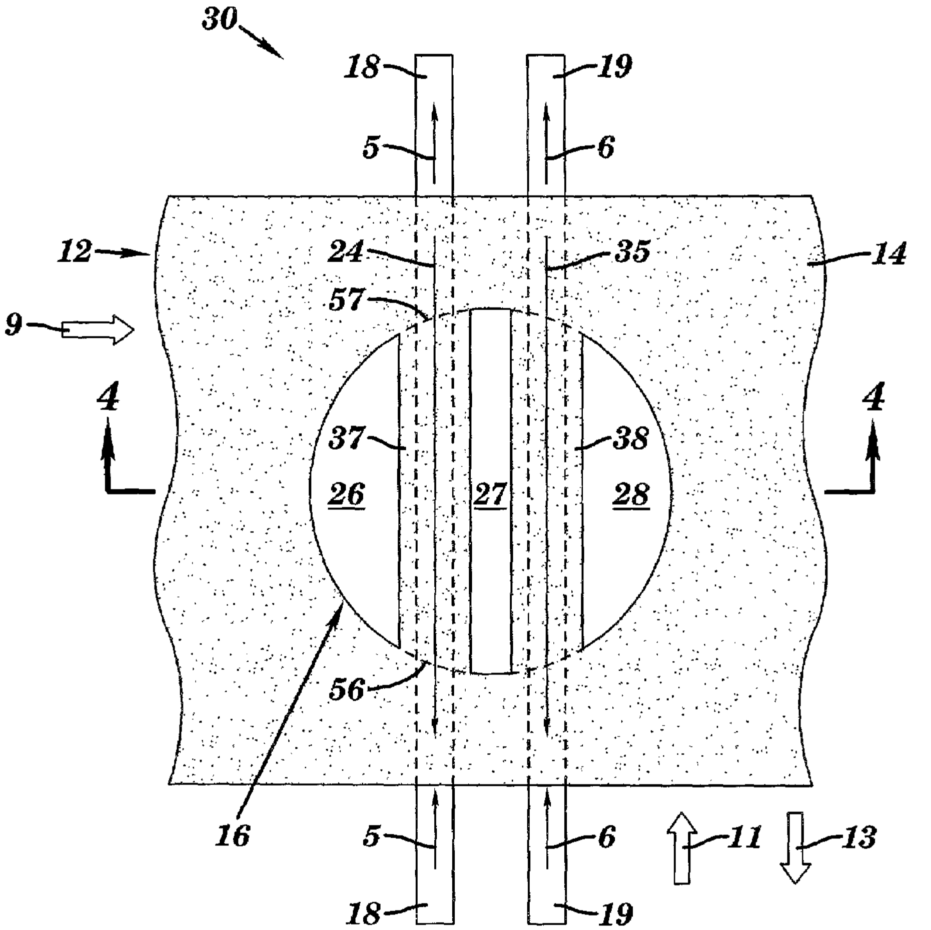
FIG. 3 depicts the top view of FIG. 1 with electrically conductive strips across the openings, in accordance with embodiments of the present invention.
Figure 4:
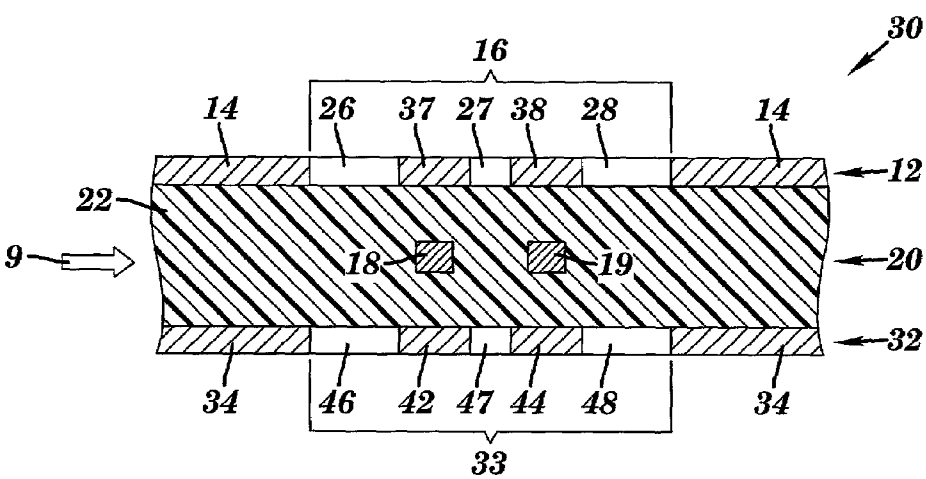
FIG. 4 depicts a front cross-sectional view taken along line 4—4 of FIG. 3, in accordance with embodiments of the present invention.

FIG. 3 depicts a top view of an electrical structure 30, and FIG. 4 depicts a front cross-sectional view taken along line 4—4 of FIG. 3, in accordance with embodiments of the present invention. The electrical structure 30 of FIGS. 3 and 4 depict the electrical structure 10 of FIGS. 1 and 2 with electrically conductive strips 37 and 38 across the opening 16, and electrically conductive strips 42 and 44 across the opening 33. The electrically conductive strips 37, 38, 42, and 44 each includes an electrically conductive material such as a metal, a metallic alloy, or a non-metallic conductor (e.g., copper, molybdenum, aluminum, conductive ink, etc.). The electrically conductive strips 37 and 42 each includes an image of that portion of the signal line 18 that projects across the openings 16 and 33, respectively. Said images of the portion of the metal signal line 18 may or may not be about (i.e., approximately) congruent to each other. Additionally, the electrically conductive strips 37 and 42 may or may not be about congruent to each other, and the electrically conductive strips 38 and 44 or may not be about congruent to each other. A first geometric entity (i.e., region, figure, shape, etc.) is said to be congruent to a second geometric entity if the first geometric entity coincides with the second geometric entity when the first geometric entity is superimposed on the second geometric entity. The electrically conductive strips 37 and 42 are at least as wide as the metal signal line 18 in the direction 9 (or wider, as shown in FIGS. 3 and 4). Similarly, the electrically conductive strips 38 and 44 are at least as wide as the metal signal line 19 in the direction 9 (or wider, as shown in FIGS. 3 and 4). The electrically conductive strips 38 and 44 each include an image of that portion of the metal signal line 19 that projects across the openings 16 and 33, respectively. The electrically conductive strips 37 and 38 result in the opening 16 having portions 26, 27, and 28 which can be used for, inter alia, the venting of gases generated in the dielectric material 22 during fabrication of the electrical structure 30. Similarly, the electrically conductive strips 42 and 44 result in the opening 33 having portions 46, 47, and 48 which can be used for, inter alia, the venting of gases generated in the dielectric material 22 during fabrication of the electrical structure 30. The portions 26, 27, and 28, in composite, of the opening 16 may have any open cross-sectional area that is sufficient for venting purposes depending on the dielectric material 22 and the processes used to fabricate the electrical structure 30 (e.g., about 0.1 square millimeters or more for some microelectronics applications). Similarly, the portions 46, 47, and 48, in composite, of the opening 33 may have any open cross-sectional area that is sufficient for venting purposes depending on the dielectric material 22 and the processes used to fabricate the electrical structure 30 (e.g., about 0.1 square millimeters or more for some microelectronics applications). The opening 16 comprising portions 26, 27, and 28 in FIGS. 3 and 4 may be formed by any method described supra for forming the opening 16 in FIGS. 1 and 2.

The openings 16 and 33, without regard to electrically conductive strips across the openings 16 and 33, may or may not be about (i.e., approximately) congruent to each other. The opening 16 is congruent to the opening 33 if the opening 16 coincides with the opening 33 when the opening 16 is superimposed on the opening 33, and vice versa.

While FIGS. 3 and 4 show the two electrically conductive strips 37 and 38 across the opening 16, the scope of the present invention generally includes one or more of such electrically conductive strips across the opening 16 and across the opening 33, depending on the number of metal signal lines (e.g., metal signal lines 18 and 19) existing in the substrate 20 and projecting across the openings 16 and 32.

If in FIGS. 3 and 4 an alternating electrical current I were to flow along the electrical flow path 5 in the signal line 18 in the direction 11, there would be an alternating electrical current $I_1$ in an electrical return flow path 24 in the metal voltage plane 12 along the electrically conductive strip 37 in the direction 13, and there would be an alternating electrical current $I_2$ in a geometrically analogous return path in the metal voltage plane 32 along the electrically conductive strip 42 in the direction 13. $I_1$ and $I_2$ are portions of I; i.e., $|I_1| \leqq |I|$, $|I_2| \leqq |I|$, and $|I_1|+|I_2| \leqq |I|$. Similarly, if in FIGS. 3 and 4 an alternating electrical current were to flow along the electrical flow path 6 in the signal line 19 in the direction 11, there would be an electrical return flow path 35 in the metal voltage plane 12 along the electrically conductive strip 38 in the direction 13, and a geometrically analogous return path in the metal voltage plane 32 along the electrically conductive strip 44 in the direction 13. The electrical flow paths 5 and 24 are images of each other looking downward into the opening 16 from the top view of FIG. 3, as are the electrical flow path 5 and the geometrically analogous return path in the metal voltage plane 32. Similarly, the electrical flow paths 6 and 35 are images of each other looking downward into the opening 16 from the top view of FIG. 3, as are the electrical flow path 6 and the geometrically analogous return path in the metal voltage plane 32. The preceding pairs of path images of electrical flow paths 5 and 24, electrical flow paths 6 and 35, etc., avoid the problems of degraded electrical performance associated with the electrical return paths 25 and 29 of FIG. 1.

The electrically conductive strips 37 and 38 are shown in FIGS. 3 and 4 as being integral with the metallic material 14 and of the same material as the metallic material 14, and may be formed as part of the process, described supra, for forming the portions 26, 27, and 28 of the opening 16. Similarly, the electrically conductive strips 42 and 44 may be integral with the metallic material 34 and of the same material as the metallic material 34, and may be formed as part of the process, described supra, for forming the portions 46, 47, and 48 of the opening 33. Other possibilities exist for the conductive strips 37, 38, 42, and 44, as illustrated infra in FIGS. 5 and 6.

Figure 5:
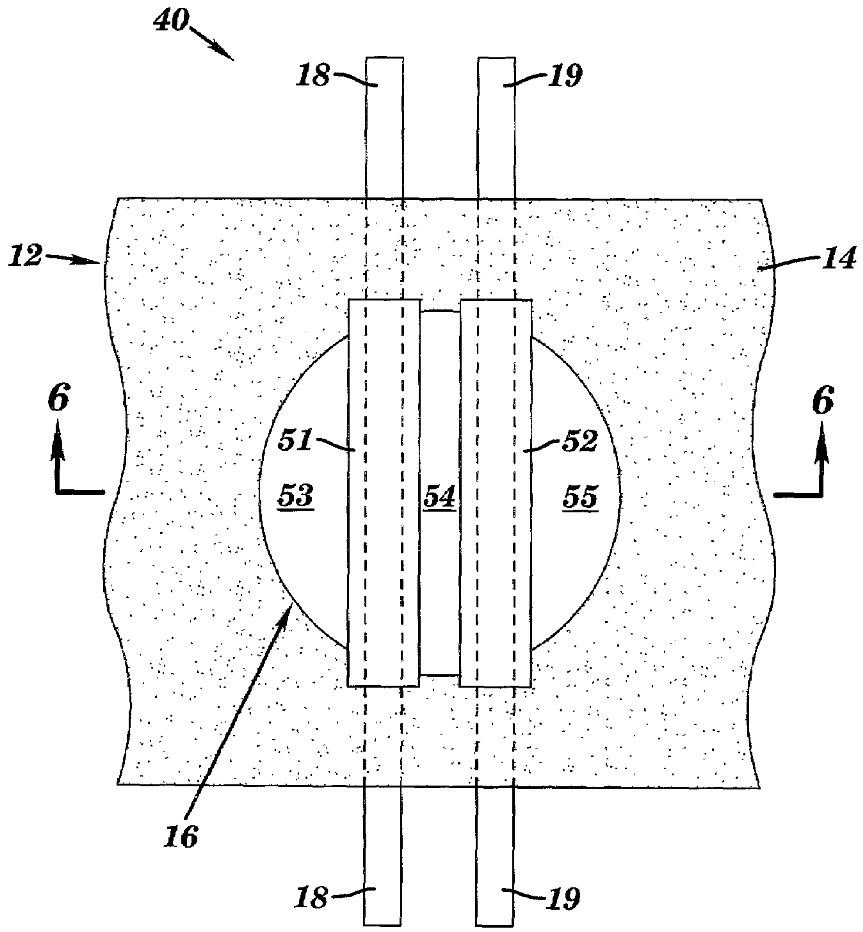
FIG. 5 depicts the top view of FIG. 3 with alternative electrically conductive strips across the openings, in accordance with embodiments of the present invention.
Figure 6:
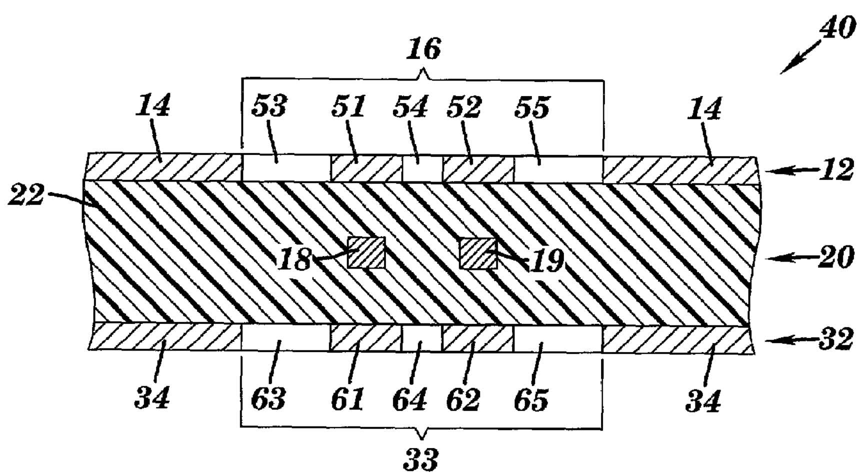
FIG. 6 depicts a front cross-sectional view taken along line 6—6 of FIG. 5, in accordance with embodiments of the present invention.

FIG. 5 depicts a top view of an electrical structure 40, and FIG. 6 depicts a front cross-sectional view taken along line 6—6 of FIG. 5, in accordance with embodiments of the present invention. The electrical structure 40 of FIGS. 5 and 6 depict the electrical structure 30 of FIGS. 3 and 4 with alternative electrically conductive strips 51 and 52 across the opening 16 for defining portions 53, 54, and 55 of the opening 16, and alternative electrically conductive strips 61 and 62 across the opening 33 for defining portions 63, 64, and 65 of the opening 33. The electrically conductive strips 51 and 52 of FIGS. 5 and 6 respectively replace the electrically conductive strips 37 and 38 of FIGS. 3 and 4, while the electrically conductive strips 61 and 62 of FIGS. 5 and 6 respectively replace the electrically conductive strips 42 and 44 of FIGS. 3 and 4. In FIGS. 5 and 6, the electrically conductive strips 51 and 52 are not integral with the metallic material 14 and thus may be formed or merged with the metallic material 14 and may be of the same or different material as the metallic material 14, and may be formed before, during, or after formation of the portions 53, 54, and 55 of the opening 16. Similarly, the electrically conductive strips 61 and 62 may not be integral with the metallic material 34 and thus may be formed or merged with the metallic material 34 and may be of the same or different material as the metallic material 34, and may be formed before, during, or after formation of the portions 63, 64, and 65 of the opening 33. The electrically conductive strips 51, 52, 61, and 62 may be formed as part of the electrical structure 40 by any method known to one of ordinary skill in the art such as by, inter alia, welding, adhesion such as with conductive epoxy, etc. Aside from the conductive strips 51, 52, 61, and 62 of FIGS. 5 and 6 respectively replacing the conductive strips 37, 38, 42, and 44 of FIGS. 3 and 4, the electrical structure 40 of FIGS. 5 and 6 is the same in function, geometry, structure, etc. as the electrical structure 30 of FIGS. 3 and 4.

The electrically conductive strip 37 in FIGS. 3 and 4 is "linear;" i.e., a centroidal path between ends 56 and end 57 of the electrically conductive strip 37 is approximately linear (i.e., not in a straight line) and thus does not include bends or curved segments. The electrically conductive strips 38, 42, and 44 in FIGS. 3 and 4 are similarly linear. Nonetheless, the electrically conductive strips of the present invention may be nonlinear as illustrated infra in FIGS. 7 and 8.

Figure 7:
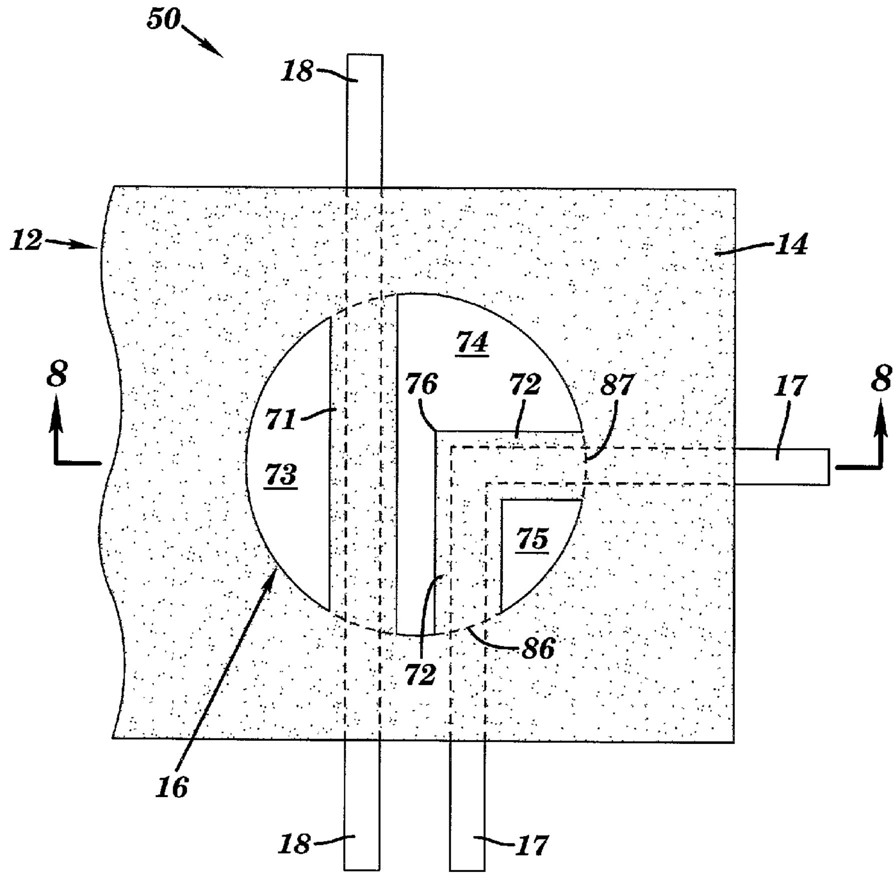
FIG. 7 depicts the top view of FIG. 3 with changed electrically conductive strips across the openings, in accordance with embodiments of the present invention
Figure 8:
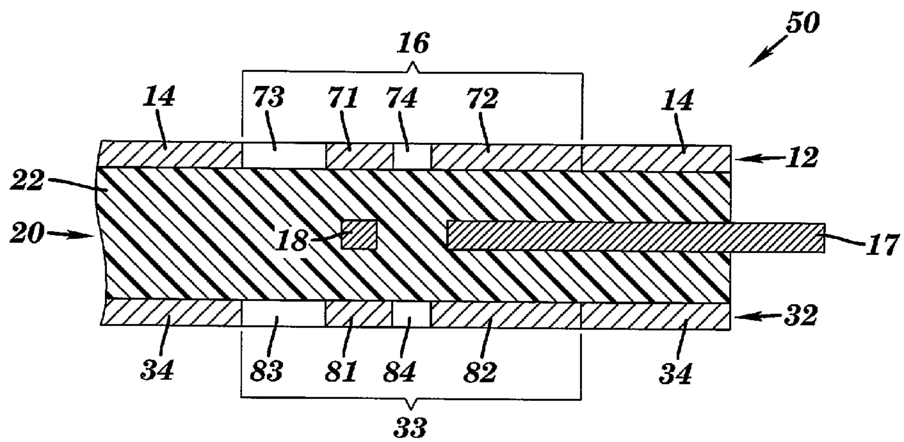
FIG. 8 depicts a front cross-sectional view taken along line 8—8 of FIG. 7, in accordance with embodiments of the present invention.

FIG. 7 depicts a top view of an electrical structure 50, and FIG. 8 depicts a front cross-sectional view taken along line 8—8 of FIG. 7, in accordance with embodiments of the present invention. The electrical structure 50 of FIGS. 7 and 8 depict the electrical structure 30 of FIGS. 3 and 4 with alternative electrically conductive strips 71 and 72 across the opening 16 for defining portions 73, 74, and 75 of the opening 16, and alternative electrically conductive strips 81 and 82 across the opening 33 for defining portions 83, 84, and 85 (portion 85 not shown) of the opening 33. The electrically conductive strips 71 and 72 of FIGS. 7 and 8 respectively replace the electrically conductive strips 37 and 38 of FIGS. 3 and 4, while the electrically conductive strips 81 and 82 of FIGS. 7 and 8 respectively replace the electrically conductive strips 42 and 44 of FIGS. 3 and 4. While the electrically conductive strips 71 and 81 are "linear," the electrically conductive strips 72 and 82 are "nonlinear." An electrically conductive strip is defined as nonlinear if it is not linear. For example, a centroidal path between ends 86 and end 87 of the electrically conductive strip 72 is not in a straight line and makes a right-angled turn at point 76 on the electrically conductive strip 72. Although not explicitly shown in FIG. 7 or 8, the electrically conductive strip 82 makes a similar right-angled turn. The metal signal line 17 is parallel to the electrically conductive strips 72 and 82, and also makes a similar right-angled turn to maintain said parallelity. The electrically conductive strips 72 and 82 each includes an image of that portion of the metal signal line 17 that projects across the openings 16 and 33, respectively. Although FIGS. 7 and 8 show the electrically conductive strip 72 as having a right-angled bend, the scope of the present invention includes a nonlinear electrically conductive strip of any type, including any degree of curvature and any angle of bend. The electrically conductive strips 72 and 82 are at least as wide as the metal signal line 17 (or wider, as shown in FIGS. 7 and 8). Aside from the nonlinear conductive strips 72 and 82 of FIGS. 7 and 8 respectively replacing the conductive strips 38 and 44 of FIGS. 3 and 4, the electrical structure 50 of FIGS. 7 and 8 is the same in function, geometry, structure, etc. as the electrical structure 30 of FIGS. 3 and 4.

The electrical structures 10, 30, 40, and 50 of FIGS. 1–2, 3–4, 5–6, and 7–8, respectively, may each represent one of a variety of different electrical structures such as, inter alia, a chip carrier or a printed circuit board.

Figure 9:
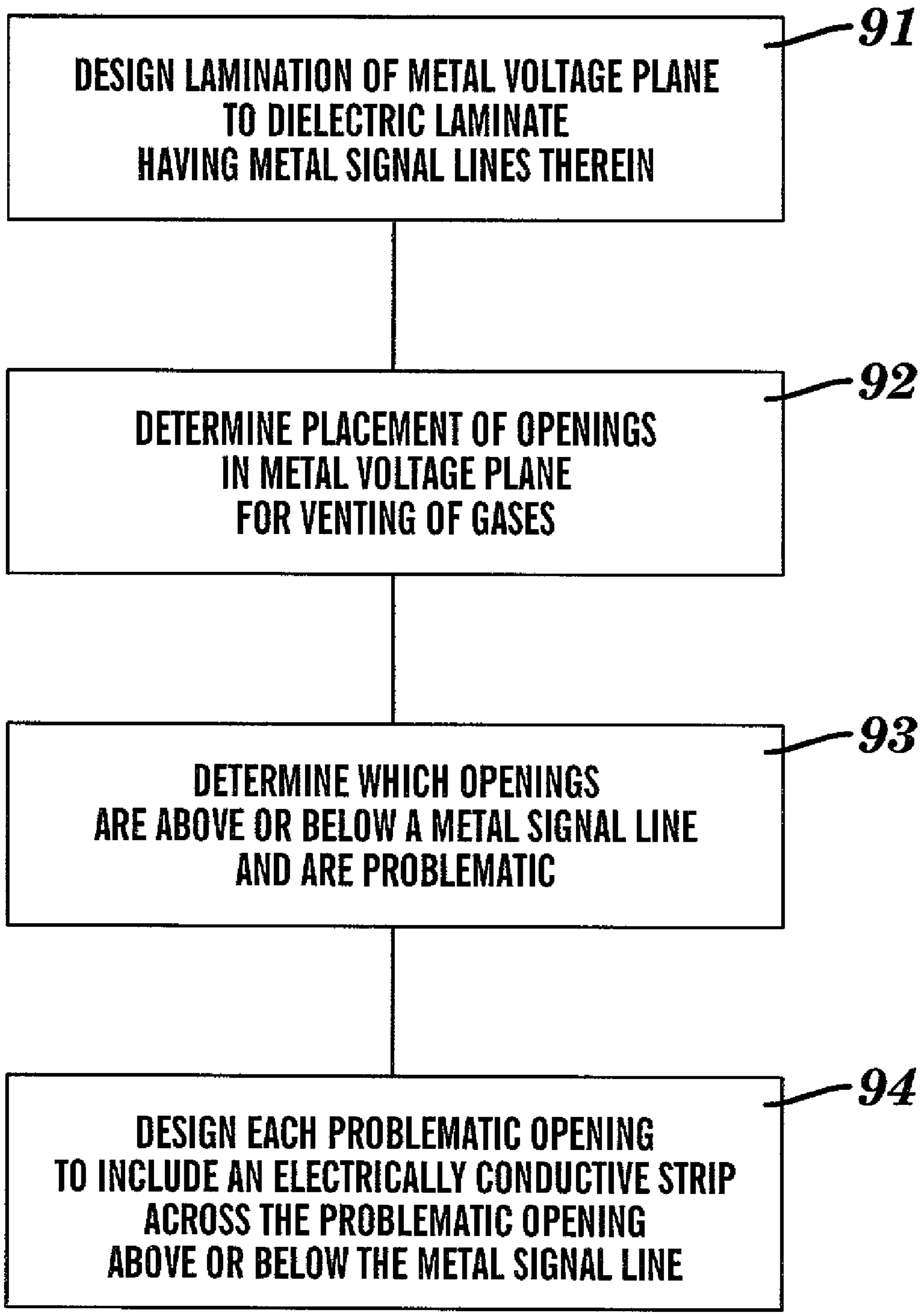
FIG. 9 is a flow chart of a method for designing any of the electrical structures of FIGS. 3–4, 5–6, or 7–8, in accordance with embodiments of the present invention.

Any of the electrical structures 10, 30, 40, and 50 of FIGS. 3–4, 5–6, and 7–8, respectively, as described herein, may be designed as shown in FIG. 9 and in accordance with embodiments of the present invention. The dielectric laminate of the electrical structure is designed (step 91) to include at least one dielectric substrate and at least one metal voltage plane, and each metal voltage plane is laminated to a corresponding dielectric substrate. Next, a determination is made (step 92) of where in each metal voltage plane to place openings for venting of gases generated during fabrication of the dielectric laminate. Of such openings, problematic openings are determined (step 93). A problematic opening is defined herein as an opening that is above or below a corresponding metal signal line within the dielectric laminate such that an image of a portion of the corresponding metal signal line projects across the problematic opening, such that the problematic opening results in unacceptably degraded electrical performance. Each problematic opening is designed (step 94) to include an electrically conductive strip across the problematic opening, wherein the electrically conductive strip includes said image.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:

a dielectric substrate having a metal signal line therein; and a first metal voltage plane laminated to a first surface of the dielectric substrate, wherein the first metal voltage plane includes an opening, wherein an image of a first portion of the metal signal line projects across the opening in the first metal voltage plane, wherein a first electrically conductive strip across the opening in the first metal voltage plane includes the image of the first portion, and wherein the first electrically conductive strip is not integral with the first metal voltage plane.

2. An electrical structure, comprising:

a dielectric substrate having a metal signal line therein; and a first metal voltage plane laminated to a first surface of the dielectric substrate, wherein the first metal voltage plane includes an opening, wherein an image of a first portion of the metal signal line projects across the opening in the first metal voltage plane, wherein a first electrically conductive strip across the opening in the first metal voltage plane includes the image of the first portion, and wherein the first electrically conductive strip is nonlinear across the opening the first metal voltage plane.

3. An electrical structure, comprising:

a dielectric substrate having a metal signal line therein; and a first metal voltage plane laminated to a first surface of the dielectric substrate, wherein the first metal voltage plane includes an opening, wherein an image of a first portion of the metal signal line projects across the opening in the first metal voltage plane, wherein a first electrically conductive strip across the opening in the first metal voltage plane includes the image of the first portion, and wherein the opening in the first metal voltage plane has a vent area of no less than about 0.1 square millimeter.

4. A method for forming an electrical structure, comprising:

providing a dielectric substrate having a metal signal line therein;

laminating a first metal voltage plane to a first surface of the dielectric substrate; and forming an opening in the first metal voltage plane such that a first electrically conductive strip across the opening includes an image of a first portion of the metal signal line, wherein the image of the first portion of the metal signal line projects across the opening in the first metal voltage plane, and wherein the electrically conductive strip is not integral with the first metallic voltage plane.

5. A method for forming an electrical structure, comprising:

providing a dielectric substrate having a metal signal line therein;

laminating a first metal voltage plane to a first surface of the dielectric substrate; and forming an opening in the first metal voltage plane such that a first electrically conductive strip across the opening includes an image of a first portion of the metal signal line, wherein the image of the first portion of the metal signal line projects across the opening in the first metal voltage plane, and wherein the first electrically conductive strip is nonlinear across the opening in the first metal voltage plane.

6. A method for forming an electrical structure, comprising:

providing a dielectric substrate having a metal signal line therein;

laminating a first metal voltage plane to a first surface of the dielectric substrate; and forming an opening in the first metal voltage plane such that a first electrically conductive strip across the opening includes an image of a first portion of the metal signal line, wherein the image of the first portion of the metal signal line projects across the opening in the first metal voltage plane, wherein the first electrically conductive strip is nonlinear across the opening in the first metal voltage plane, and wherein the opening in the first metal voltage plane has a vent area of no less than about 0.1 square millimeters.

7. A method for designing an electrical structure that includes a dielectric laminate, said method comprising:

designing the dielectric laminate to include at least one dielectric substrate and at least one metal voltage plane, wherein a first metal voltage plane of the at least one metal voltage plane is laminated to a first dielectric substrate of the at least one dielectric substrate;

determining where in the at least one metal voltage plane to place openings for venting of gases generated during fabrication of the dielectric laminate;

determining at least one problematic opening of the openings, wherein the at least one problematic opening is above or below a corresponding metal signal line within the dielectric laminate such that an image of a portion of the corresponding metal signal line projects across the at least one problematic opening; and designing the at least one problematic opening to include an electrically conductive strip across the at least one problematic opening, wherein the electrically conductive strip includes the image.

8. An electrical structure, comprising:

a dielectric substrate having a metal signal line therein; and a first metal voltage plane laminated to a first surface of the dielectric substrate, wherein the first metal voltage plane includes an opening, wherein an image of a first portion of the metal signal line projects across the opening in the first metal voltage plane, and wherein a first electrically conductive strip across the opening in the first metal voltage plane includes the image of the first portion and wherein the opening in the first metal voltage plane has an outer boundary whose shape is circular or elliptical, wherein the first metal voltage plane comprises a first metal, wherein the first electrically conductive strip comprises a second metal, and wherein the first metal differs from the second metal.

9. A method for forming an electrical structure, comprising:

providing a dielectric substrate having a metal signal line therein;

laminating a first metal voltage plane to a first surface of the dielectric substrate;

and forming an opening in the first metal voltage plane such that a first electrically conductive strip across the opening includes an image of a first portion of the metal signal line, wherein the image of the first portion of the metal signal line projects across the opening in the first metal voltage plane and wherein the opening in the first metal voltage plane has an outer boundary whose shape is circular or elliptical, wherein the first metal voltage plane comprises a first metal, wherein the first electrically conductive strip comprises a second metal, and wherein the first metal differs from the second metal.

10. A method for forming an electrical structure, comprising the steps of:

providing a dielectric substrate having a metal signal line therein;

laminating a first metal voltage plane to a first surface of the dielectric substrate;

and forming an opening in the first metal voltage plane such that a first electrically conductive strip across the opening includes an image of a first portion of the metal signal line, wherein the image of the first portion of the metal signal line projects across the opening in the first metal voltage plane, and wherein step of laminating the first metal voltage plane to the first surface of the dielectric substrate is performed before the step of forming the opening in the first metal voltage plane, wherein the first metal voltage plane comprises a first metal, wherein the first electrically conductive strip comprises a second metal and wherein the first metal differs from the second metal.

11. A method for forming an electrical structure, comprising the steps of:

providing a dielectric substrate having a metal signal line therein;

laminating a first metal voltage plane to a first surface of the dielectric substrate;

and forming an opening in the first metal voltage plane such that a first electrically conductive strip across the opening includes an image of a first portion of the metal signal line, wherein the image of the first portion of the metal signal line projects across the opening in the first metal voltage plane, and wherein step of laminating the first metal voltage plane to the first surface of the dielectric substrate is performed after the step of forming the opening in the first metal voltage plane, wherein the first metal voltage plane comprises a first metal, wherein the first electrically conductive strip comprises a second metal and wherein the first metal differs from the second metal.

* * * * *

UNITED STATES PATENT AND TRADEMARK OFFICE
CERTIFICATE OF CORRECTION

PATENT NO. : 6,977,345 B2
DATED : December 20, 2005
INVENTOR(S) : Budell et al.

It is certified that error appears in the above-identified patent and that said Letters Patent is hereby corrected as shown below:

Column 7,
Line 28, delete “opening the” and insert -- opening in the --.
Line 42, delete “millimeter” and insert -- millimeters --.

Signed and Sealed this

Twenty-first Day of February, 2006

JON W. DUDAS
*Director of the United States Patent and Trademark Office*